United States Patent
Spitler et al.

[19]

[11] Patent Number: 5,958,573
[45] Date of Patent: Sep. 28, 1999

[54] ELECTROLUMINESCENT DEVICE HAVING A STRUCTURED PARTICLE ELECTRON CONDUCTOR

[75] Inventors: Mark Spitler, Concord; Christina Lampe-Onnerud; Per Onnerud, both of Newtonville, all of Mass.

[73] Assignee: Quantum Energy Technologies, Cambridge, Mass.

[21] Appl. No.: 08/796,778

[22] Filed: Feb. 10, 1997

[51] Int. Cl.$^6$ .................................................. H05B 33/00
[52] U.S. Cl. ...................... 428/323; 428/330; 428/403; 428/690; 428/917; 313/503; 313/504; 313/506; 257/88; 257/89; 257/103
[58] Field of Search .................... 428/690, 917, 428/323, 330, 411.1, 457, 403; 313/502, 503, 504, 506; 257/40, 43, 103, 88, 89

[56] References Cited

U.S. PATENT DOCUMENTS

| | | | |
|---|---|---|---|
| 3,919,589 | 11/1975 | Hanak | 315/71 |
| 4,672,265 | 6/1987 | Eguchi et al. | 313/504 |
| 4,686,110 | 8/1987 | Endo et al. | 427/38 |
| 4,721,631 | 1/1988 | Endo et al. | 427/66 |
| 4,725,513 | 2/1988 | Eguchi et al. | 428/690 |
| 4,769,292 | 9/1988 | Tang et al. | 428/690 |
| 4,814,668 | 3/1989 | Tohda et al. | 313/506 |
| 4,885,211 | 12/1989 | Tang et al. | 428/457 |
| 4,907,043 | 3/1990 | Uekita et al. | 357/17 |
| 4,931,692 | 6/1990 | Takagi et al. | 313/503 |

(List continued on next page.)

FOREIGN PATENT DOCUMENTS

| | | |
|---|---|---|
| 0622439 | 11/1994 | European Pat. Off. |
| 8602734 | 5/1986 | WIPO . |

OTHER PUBLICATIONS

D.J. DiMaria et al, Electroluminescence studies in silicon dioxide films containing tiny silicon islands; J. Appl. Phys., vol. 56, No. 2, Jul. 15, 1984, pp. 401–416.

Ichinose et al., Formation of a Novel CdS Cluster in an Organic Multilayer Template: A Case of an Organic/Inorganic Superlattice, J. Phys. Chem. vol. 99, No. 11, 1995, pp. 3736–3742.

(List continued on next page.)

*Primary Examiner*—Marie Yamnitzky
*Attorney, Agent, or Firm*—Choate, Hall & Stewart

[57] ABSTRACT

An electroluminescent device is disclosed which has an electron conductor fabricated from a stable low electron affinity substance in combination with an emitting species and a hole conductor. The hole conductor and the electron conductor transport to opposed sides of the emitting species holes and electrons respectively that cause the emitting species to undergo a quantum change of state and generate light. In one embodiment the electron conductor is comprised of a plurality of structured particles, each in electrical communication with each other, where the plurality of structured particles are small enough so as their properties deviate from the bulk properties of the substance from which the structured particles are fabricated. In this embodiment the plurality of structured particles are also crystalline in nature. The plurality of structured particles are also in contact with an emitting species and act as an electron conductor. Another embodiment of the electroluminescent device uses more than one of plurality of structured particles, more than one emitting species and more than one hole conductor, such that each combination of one plurality of structured particles, emitting species, and hole conductor emits a different predetermined wavelength of light.

29 Claims, 4 Drawing Sheets

U.S. PATENT DOCUMENTS

| | | | |
|---|---|---|---|
| 5,059,861 | 10/1991 | Littman et al. | 313/503 |
| 5,061,569 | 10/1991 | VanSlyke et al. | 428/457 |
| 5,069,815 | 12/1991 | Aoki et al. | 252/301.36 |
| 5,073,446 | 12/1991 | Scozzafava et al. | 428/323 |
| 5,093,210 | 3/1992 | Ohta et al. | 428/690 |
| 5,200,668 | 4/1993 | Ohashi et al. | 313/498 |
| 5,229,628 | 7/1993 | Kobayashi et al. | 257/103 |
| 5,247,190 | 9/1993 | Friend et al. | 257/40 |
| 5,253,258 | 10/1993 | Lawandy | 372/22 |
| 5,306,441 | 4/1994 | Reddy et al. | 252/301.4 |
| 5,389,444 | 2/1995 | Hosokawa et al. | 428/457 |
| 5,405,709 | 4/1995 | Littman et al. | 428/690 |
| 5,408,109 | 4/1995 | Heeger et al. | 257/40 |
| 5,416,213 | 5/1995 | Hasegawa et al. | 544/405 |
| 5,434,878 | 7/1995 | Lawandy | 372/43 |
| 5,443,921 | 8/1995 | Hosokawa et al. | 428/690 |
| 5,448,582 | 9/1995 | Lawandy | 372/42 |
| 5,455,489 | 10/1995 | Bhargava | 315/169.4 |
| 5,457,565 | 10/1995 | Namiki et al. | 359/273 |
| 5,489,398 | 2/1996 | Reddy et al. | 252/301.4 |
| 5,531,928 | 7/1996 | Karam et al. | 252/301.4 |
| 5,537,700 | 7/1996 | Alivisatos et al. | 313/506 |
| 5,543,237 | 8/1996 | Watanabe | 428/691 |

OTHER PUBLICATIONS

D. Clery, After Years in the Dark, Electric Plastic Finally Shines, Science, vol. 263, Mar. 25, 1994, pp. 1700–1702.

Burrows et al., Relationship between electroluminescence and current transport in organic heterojunction light–emitting device, J. Appl. Phys., vol. 79, No. 10, May 15, 1996, pp. 7991–8006.

Kido, Shionoya, and Nagai, Single–layer white light–emitting organic electroluminescent devices based on dye–dispersed poly(N–vinylcarbazole), Appl. Phys. Lett., vol. 67, No. 16, pp. 2281–2283, Oct. 16, 1995.

Brian O'Regan et al., Vectorial Electron Injection into Transparent Semiconductor Membranes and Electric Field Effects on the Dynamics of Light–Induced Charge Separation, Journal of Physical Chemistry, vol. 94, No. 24, pp. 8720–8726, 1990.

Andrew W. Knight et al., Occurrence, Mechanisms and Analytical Applications of Electrogenerated Chemiluminescence, Analyst, May 1994, vol. 119, pp. 879–890.

Robert F. Service, Organic LEDs Begin Producing Bright White Light, Science vol. 267, Mar. 3, 1995, (page number not given).

William R. Salaneck et al., The Metal–on–Polymer Interface in Polymer Light Emitting Diodes, Adv. Materials 1996, 8, No. 1, pp. 48–52.

Zhang, O'Neil and Roberti, Femtosecond studies of interfacial electron–hole recombination in aqueous CdS colloids, Appl. Phys. Lett., vol. 64, No. 15, Apr. 11, 1994, pp. 1989–1991.

Z.H. Lu et al., Quantum confinement and light emission in $SiO_2$/Si superlattices, Nature, vol. 378, Nov. 16, 1995, pp. 258–260.

Han et al., Molecular beam epitaxy growth of pseudomorphic II–VI multilayered structures for blue/green laser diodes and light–emitting diodes, J. Vac. Sci. Technol. B, vol. 12, No. 2, Mar./Apr. 1994, pp. 254–1257.

Yutaka Ohmori, et al.; Visible–Light Electroluminescent Diodes Utilizing Poly (3–alkylthiophene); Japanese Journal of Applied Physics; vol. 30, No. 11B, Nov., 1991 pp. L1938–L1940.

A.J. McEvoy, et al.; Sensitisation in photochemistry and photovoltaics; Solar Energy Materials and Solar Cells 32 (1994); pp. 221–227.

Y. Nakanishi et al.; Effect of insulating layer structural properties for thin–film electroluminescent devices; Materials Chemistry and Physics 43 (1996); pp. 292–295.

K. Vanheusden et al.; Mechanisms behind green photoluminescence in ZnO phosphor powders; J. Appl. Phys. 79(10), May 15, 1996; pp. 7983–7990.

Dirk Ammermann et al.; Photonic Devices Based on Crystalline Organic Semiconductors for Optoelectronic Integrated Circuits; Jpn. J. Appl. Phys; vol. 34 (Feb. 1995) Pt. 1, No. 2B; pp. 1293–1297.

Feng Yan et al.; Photoluminescence spectra of $C_{60}$ molecules embedded in porous Si; Appl. Phys. Lett. 67 (23), Dec. 4, 1995; pp. 3471–3473.

Christopher N. King; Electroluminescent displays; J. Vac. Sci. Technol. A, vol. 14, No. 3, May/Jun. 1996; pp. 1729–1735.

Liu Zugang et al.; Organic thin film electroluminescent devices with ZnO: Al as the anode; J. Phys.: Condens. Matter 8 (1996) pp. 3221–3228.

G. Wang et al.; Enhancement of organic electroluminescent intensity by charge transfer from guest to host; Journal of Luminescence 68 (1996); pp. 49–54.

A. Schmidt et al; Electronic states of vapor deposited electron and hole transport agents and luminescent materials for light–emitting diodes; J. Appl. Phys. 78(9), Nov. 1, 1995; pp. 5619–5625.

V.L. Colvin et al.; Light–emitting diodes made from cadmium selenide nanocrystals and a semiconducting polymer; Nature, vol. 370, Aug. 4, 1994; pp. 354–357.

Marko Strukelj et al.; Design and Application of Electron-Transporting Organic Materials; Science, vol. 267, Mar. 31, 1995, pp. 1969–1972.

D.B. Romero et al.; Blue Light–Emission From A Nanostructured Organic Polymer Semiconductor; Solid State Communications, vol. 95, No. 3, pp. 185–189, 1995.

ELECTROLUMINESCENT DEVICE HAVING A STRUCTURED PARTICLE ELECTRON CONDUCTOR

BACKGROUND OF THE INVENTION

This invention relates to electroluminescent devices and, in particular, to an electroluminescent device which uses a low electron affinity electron conductor as the electron transport device to facilitate the generation of light.

Electroluminescent devices can be used in display applications interchangeably with liquid crystal devices ("LCDs") and cathode ray tubes ("CRTs"), among others. Applications for electroluminescent devices, LCDs and CRTs are expanding and include medical, consumer, and communication applications to name a few. However, electroluminescent devices have cornered only a small share of this expanding market. This is partly due to various deficiencies of the electroluminescent devices currently on the market.

One type of electroluminescent device uses impact ionization to cause luminescence within an electronic material. In general, these devices apply an electron voltage to induce a photon emission from the electronic material, which can include a host solid, such as ZnO or ZnS, and metals placed within a host lattice, such as rare earth metals. These devices generate a large quantity of heat, and thus have a short life time. Another type of electroluminescent device uses avalanche excitation and tunnel injection mechanisms to cause the luminescence. These devices demonstrate similar limitations. All these devices also have high power requirements.

Another type of electroluminescent device that uses inorganic elements relies on injecting minority carriers into a solid state material, such as GaAs or GaP, to cause recombination in the majority carrier region and the emission of a photon. The color spectrum that these devices can emit is usually limited to the band-gap of the solid. Although the introduction of GaN has extended the emissions of these electroluminescent devices to the blue portion of the spectrum, the electroluminescent devices require quantum wells for fabrication to increase the energy of the emitted light. Thus, the devices that can emit colors from all portions of the visible spectrum are expensive to fabricate.

Organic electroluminescent devices have several advantages over the inorganic devices in that they are easier to fabricate and have a greater efficiency by an order of magnitude. Organic electroluminescent devices also require lower voltages and can emit light throughout the visible spectrum. The cathode element of the organic electroluminescent devices still exhibits several problems. The cathode is usually fabricated from a substance that has a low work function, such as alkaline metals and alkaline earth metals, for example. However, many metals spontaneously oxidize when exposed to oxygen. A thin layer of the oxide is formed on a surface of the cathode, usually on the surface juxtaposed to the electroluminescent device. The oxidation diminishes the amount of free electrons available to be transported into the electroluminescent device.

Moreover, the electron mobility of the electron conductor in the organic electroluminescent device is fairly low. Thus, the organic devices, while exhibiting a higher efficiency overall, have poorer electron transport characteristics when contrasted with an electroluminescent devices that has an inorganic electron conductor.

Another problem associated with an electron transport material in the organic electroluminescent device is that it generates heat when an electric field is created across the device. Heat results in a loss of efficiency and long term degradation of the electroluminescent device. Efficiency is decreased because any energy released as heat cannot then be used to generate luminescence. In addition, the resistivity of the electron transport material will increase with the increase in temperature and not conduct the electrons as efficiently. Further, the heat leads to long term degradation of the device owing to creation of short circuits through the conducting organic elements, creation of gas pockets formed at the metal-organic interface caused by the loss of adhesion of the organic substance to the metal substance acting as the cathode or electron transport material, and crystallization of any hole conducting molecules.

One approach to solving the stability problem associated with a cathode fabricated from metal involves using an alloyed metal as the cathode. While this may improve the oxidation problems, the electroluminescent device still suffers from stability problems due to fabricating the cathode adjacent to organic materials. The difficulty of fabricating the electroluminescent device is increased when the cathode is a crystalline metal. Moreover, such devices usually require a permanent seal to guard against degradation. Thus, such devices become even more costly to fabricate and still are not very robust.

Accordingly it is an object of this invention to provide an electroluminescent device that is more stable and has a longer life time.

It is also an object of this invention to provide an electroluminescent device that has lower power requirements.

It is a further object of this invention to provide an electroluminescent device that decreases the generation of heat.

It is another object of this invention to provide an electroluminescent device that can be fabricated using less expensive fabrication techniques while having a high efficiency.

It is another object of the invention to provide an electroluminescent device that has the efficiency characteristics of an organic electroluminescent device or better while providing an electron conductor that has the mobility more like that of an inorganic electron conductor.

It is another object of this invention to provide an electroluminescent device with a low work function cathode.

These and other objects of the invention will be obvious and will appear hereinafter.

SUMMARY OF THE INVENTION

The aforementioned and other objects of the invention are achieved by the invention that is versatile and amenable for use in a variety of devices. Examples of such a device are a digital watch face or a car radio display. In one embodiment, the electroluminescent device comprises a hole conductor, an electron conductor, and an emitting species. The hole conductor is fabricated from an organic substance adapted to carry holes to the emitting species. The electron conductor has a low electron affinity. It is adapted to carry electrons to the emitting species. The emitting species is interposed between the hole conductor and the electron conductor adapted to receive electrons and holes that cause the emitting species to undergo a quantum change of state and generate light. The two transport elements the electron conductor and the hole conductor can perform charge transport in parallel within different positions in the electroluminescent device.

In the preferred embodiment, the electron conductor comprises a plurality of structured particles in electrical communication with each other. The plurality of structured particles transports electrons to the emitting species. The plurality of structured particles is chosen or engineered such that they are conducive to charge transport, for example by having a high electron mobility and a low work function. They are also chosen or engineered such that they facilitate luminescence in the emitting species. In one embodiment each of the plurality of structured particles is crystalline in nature, while the electron conductor comprised of the plurality of structured particles is amorphous in nature.

The emitting species can also be a plurality of luminescent structured particles, which is likewise engineered to exhibit predetermined properties.

Another embodiment of the electroluminescent device further includes the addition of a cathode in electrical communication with the electron conductor, a hole conductor in contact with the emitting species, and an anode in electrical communication with the hole conductor. In this embodiment the cathode provides the electrons to the electroluminescent device under the application of an applied bias. This embodiment can be fabricated in layers such that, in sequence, the electroluminescent device comprises the cathode, the electron conductor having the plurality of structured particles, the emitting species, the hole conductor, and the anode.

In an embodiment the emitting species is not layered at as an integrated device. This embodiment is easily fabricated. After the plurality of structured particles is formed, the emitting species diffuses between the plurality of structured particles. The hole conductor can be similarly disposed in the electroluminescent device. Further, one can place one electroluminescent device of this embodiment adjacent to a second electroluminescent device of this embodiment, up to N such devices. The resulting electroluminescent device is a composite of more than one emitting species, more than one plurality of structured particles and more than one hole conductors. Thus, it can emit more than one wavelength of light. For example, the electroluminescent device can comprise, in sequence, a first emitting species that emits red light disposed in a first plurality of structured particles, a second emitting species that emits blue light disposed in a second plurality of structured particles, and a third emitting species that emits green light disposed in a third plurality of structured particles. Thus, the electroluminescent device emits red, blue, and green light and has many applications well known in the art, such as lap-top displays.

In a further embodiment, the function performed by the hole conductor can be performed by the emitting species, for example, thus, the hole conductor can be eliminated.

In further aspects, the invention provides methods of use in accord with the apparatus described above.

The aforementioned and other aspects of the invention are evident in the drawings and in the description that follows.

BRIEF DESCRIPTION OF THE DRAWINGS

The foregoing and other objects of this invention, the various features thereof, as well as the invention itself, may be more fully understood from the following description, when read together with the accompanying drawings in which.

DETAILED DESCRIPTION OF THE DRAWINGS

While the present invention can be fabricated with numerous different materials and embodied in a wide variety of forms, it is described herein in four preferred forms. Though these are the preferred embodiments and will be described as such, one skilled in the art will realize that there are numerous different configurations that can be employed other than those described herein and, therefore, these preferred embodiments should be considered illustrative and not restrictive.

Figure 1:
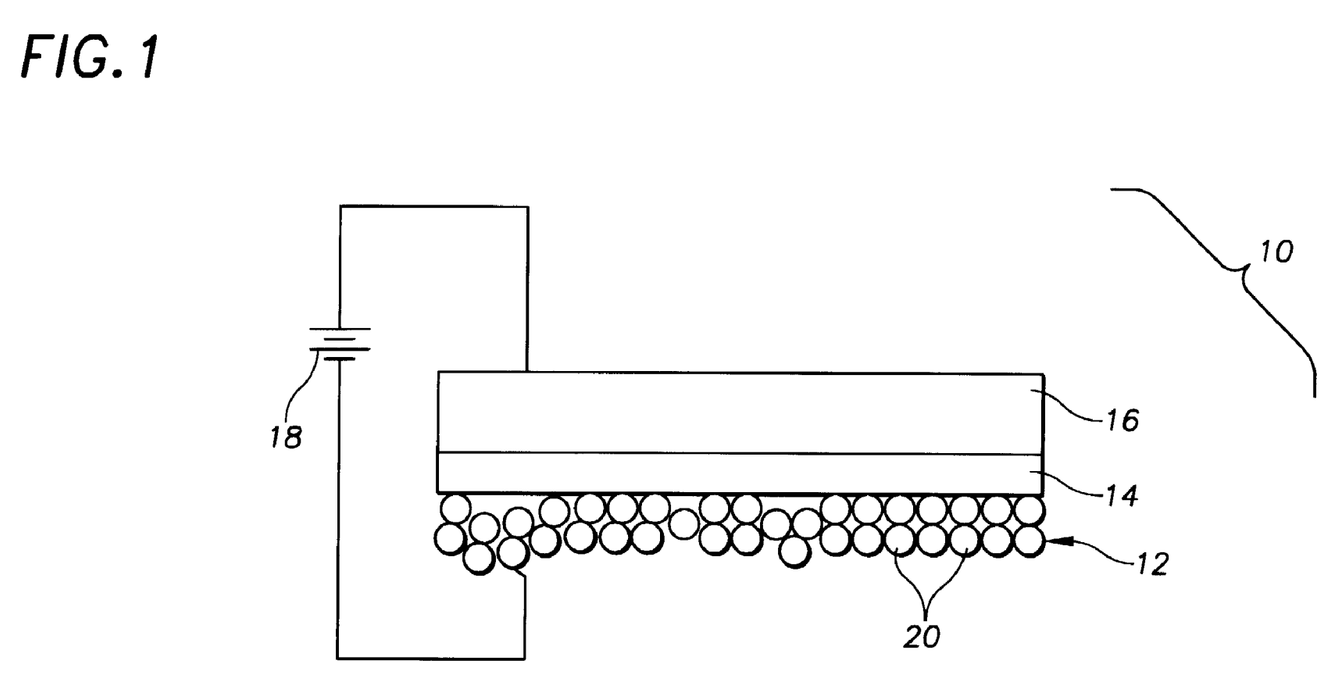
FIG. 1 is a block diagram of an electroluminescent device in accordance with an embodiment of the invention.

FIG. 1 depicts an electroluminescent device 10 constructed in accordance with the invention. The electroluminescent device 10 comprises in sequence an electron conductor 12, an emitting species 14 and a hole conductor 16.

The electron conductor 12 acts as the electron transport material. The electron conductor is fabricated from a substance that is relatively stable, has a low electron affinity and has sufficient conductive properties to transport electrons to the emitting species 14. In the preferred embodiment, the electron conductor 12 is also comprised of a plurality of structured particles 20.

As this term is used herein structured particles denotes particles of any substance that has dimensions small enough such that the properties of the particles begin to deviate from the bulk properties of the substance. The most important properties for this invention being the spectroscopic properties. Structured particles that meet the above definition are usually, but not necessarily in the range of 1 nanometer to $10^5$ nanometers in size, predominantly in the 1-sub 900 nanometer range. The size of the structured particles will vary depending on the substance from which they are manufactured. The radius of the structured particle that meet the above definition is also usually, but not necessarily, smaller than the Bohr radius of the first excitation state of the substance from which the structured particle is fabricated.

Where the Bohr radius is defined as $$r = [(4\pi \in \in_0 \hbar^2)/(m_{eff} e^2)]n^2$$

where $\hbar^2 = h/(2\pi) = (4.136 \times 10^{-15} \text{ eV/s})/(2\pi)$ $\in_0$ = the permittivity in a vacuum $m_{eff}$ = the effective mass of the particle e = the electron charge, $1.602 \times 10^{-19}$ C n = the quantum state $\in$ = dialectric constant At or near such dimensions, it is possible to see a change in a substances properties compared to the properties of a bulk substance. The plurality of structured particles 20 can have a wide range of physical properties that may be engineered, as described herein, or selected for their usefulness in the electroluminescent device 10.

Although not necessary, in the preferred embodiment the plurality of structured particles 20 are nonmetallic in nature. The plurality of structured particles are nonmetallic such that they do not quench the excited state of the emitting species through energy transfer to the electrons in the acceptor level of the emitting species. The plurality of structured particles are, however, capable of transporting charge to the emitting species.

The plurality of structured particles only need evidence sufficient conductive properties to transport electrons through a portion of the electron conductor to the emitting species. As such, the electron conductor 12 can be fabricated from, inter alia, inorganic materials, such as metal oxides, including ZnO, $TiO_2$, $SrTiO_3$, for example, and metals, among others. The electron conductor can be manufactured using an organometallic material as a precursor to the inorganic electron conductor 12. These materials have a higher electron mobility than most organic electron conductors. These materials are also be chosen such that they possess a low electron affinity, making them suitable to transport electrons to the emitting species. Moreover, when the plurality of structured particles 20 are metal oxides, the problems associated with oxidation are substantially eliminated. Other precautionary measures can also be circumvented, for example such as sealing. Thus, the electroluminescent device 10 will be a more stable device.

Although not necessary, in the preferred embodiment each of the plurality of structured particles 20 are crystalline in nature. Thus, they are less susceptible to problems associated with heat generation in that they will not as easily transform into structures that facilitate short circuits. They also will reduce the production of heat in contrast to an impact ionization device or a quantum well device in that the structured particles do not have to be supplied with as large an amount of energy to transport the electrons through the electron conductor 12. Again, making the device more stable.

The crystalline character of the plurality of structured particles also allows one to control the electron affinity of the plurality of structured particles as the size of the plurality of structured particles approaches the bohr radius of the first excitation state.

The electron conductor 12, however, does not need to be fabricated as a crystalline layer of the plurality of structured particles 20. Each of the plurality of structured particles 20 can be crystalline in nature while the layer of the plurality of structured particles will be amorphous. This enables the device to be fabricated by less expensive methods while again being more stable, and further benefiting from the crystalline aspects of the plurality of structured particles 20.

As part of the fabrication process, the plurality of structured particles 20 must also be brought into electrical contact with one another. The contact established amongst the plurality of structured particles 20 need only be enough contact for electrons to be transported across the electron conductor 12. The contact can be physical contact or just sufficient proximity such that electrons can be transported to the emitting species 14 when under the influence of an electric field.

As those skilled in the art will realize, establishing the contact amongst the plurality of structured particles 20 can be accomplished in several ways, including thermal processes, inter alia, sintering or annealing and chemical process, oxidation, inter alia. The plurality of structured particles 20 can be brought into electrical communication with one another either during formation of the electroluminescent device 10 or as a final step in the fabrication of the electroluminescent device 10.

Figure 2:
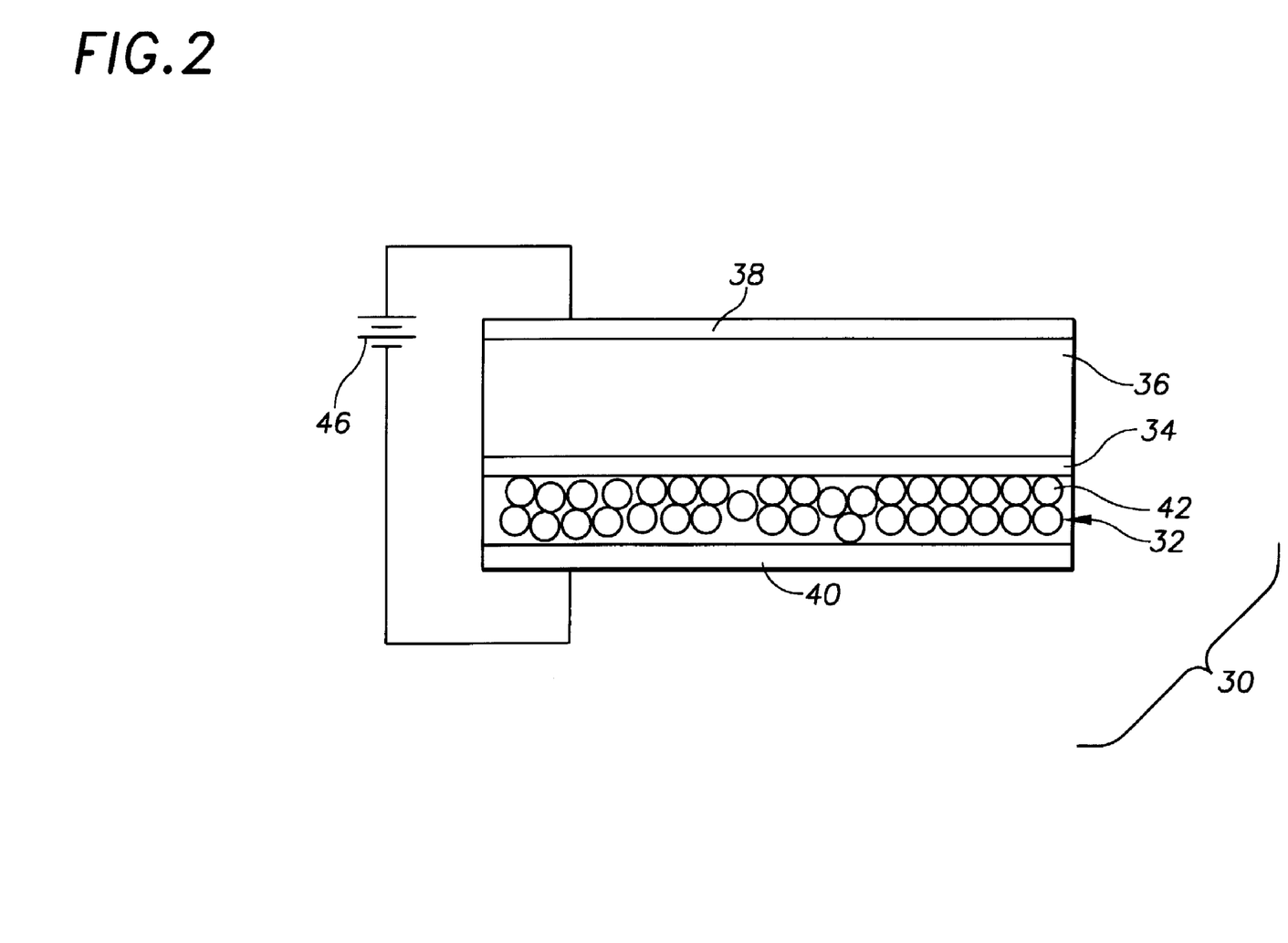
FIG. 2 is a block diagram of a second embodiment of the invention.

A metallic contact layer (as shown in FIG. 2), the crystalline form of the plurality of structured particles 20, the emitting species 14 or the hole conductor 16 can be fabricated using numerous techniques, including growing them from seed material, such as by epitaxy or bulk crystal growth, for example, vapor deposition such as evaporation and sputtering, for example, or liquid phase techniques, among others.

The emitting species 14 can be fabricated from many substances, including organic, inorganic or organometallic substances. An example of an organometallic substance includes a ruthenium complex, such as Ru(II)tris (phenanthroline). Among the organic substances that can be used as an emitting species 14 include $Alq_3$, inter alia, dyes, such as a dye derived from squaric acid, inter alia, or electrically conducting polymers. Further, a dye can be used in combination with other substances, such as Perylene Chromophore and Ru(II)trisbipyridyl, for example. The bipyridyl groups can also be exchanged with phenathroline groups. Regardless, the emitting species 14 deposited upon the electroluminescent device 10 has to be fairly thin.

Alternatively, the emitting species 14 can comprise a plurality of luminescent structured particles that are inorganic, organic or organometallic. The plurality of luminescent structured particles that comprise the emitting species 14 have many of the same or similar characteristics as the plurality of structured particles 20 that comprise the electron conductor 12, for example, the selection or engineering of the acceptor level of the plurality of luminescent structured particles. In addition, the plurality of luminescent structured particles can be selected such that the emit a predetermined wavelength of light based upon their internal bonding structure and their band-gap.

The electroluminescent device 10 has an additional layer, the hole conductor 16. The hole conductor 16 is chosen such that it carries positive charge towards the emitting species 14 when exposed to an applied bias. Due to internal equilibrium forces in the electroluminescent device 10, the hole conductor 16 can also carry positive charge towards the emitting species 14 without the application of an electric field. One characteristic of such a hole conductor 16 is that it has a high work function relative to the electron conductor 12, where a work function is the energy needed to remove an electron from the Fermi level to a point outside the surface of the substance.

The electroluminescent device 10 efficiently produces photons, in that the electron conductor 12 transports electrons to the emitting species 14, while the hole conductor 16 carries positive charge to the emitting species 14. The presence of at least some overlap of the carrying of electrons and holes by the electron conductor and the hole conductor respectively contributes to the efficient production of photons when the electrons and holes recombine within the electroluminescent device. Where both transport elements the electron conductor 12 and the hole conductor 16 carry the charge owing to either the internal equilibrium forces or under the influence of an applied bias.

The nature of the electronic contact between the hole conductor and the emitting species 14 can be, while not necessarily so, less than the physical contact necessary between the emitting species 14 and the electron conductor 12. The electronic contact established between the hole conductor 16 and the emitting species 14 only has to be sufficient to enable the hole conductor 16 to transport positive charge to the emitting species 14.

The hole conductor 16 can carry the positive charge in either a solid or liquid phase. As one skilled in the art will realize, the hole conductor 16 can be fabricated from numerous substances or combinations thereof, being limited only by the substances thermal and kinetic suitability with the emitting species 14 and its ease of fabrication. An example of a liquid phase hole conductor is a redox couple in a solvent, where the solvent may be aqueous or non-aqueous in nature. Examples of such a solvent include water or acetonitrile, inter alia. Examples of the redox couple include an iodide/triodide couple or a ruthenium hexamine couple. The hole conductor 16 can also fabricated from an organic solid state species, such as any number of triphenylamine derivatives, for example.

Depending on the nature of the hole conductor, the hole conductor can be applied to the electroluminescent device by several methods. It can be deposited from solution and used in its polymerized form, for example. The hole conductor 16 can also be fabricated so as to contact the emitting species 14 by the methods described above, where suitable.

Electrically conducting polymers are also suitable for use as the hole conductor. Examples include polyphenylenevinylene, polycarbazole among others. The electrically conducting polymer can be formed before or during the fabrication of the electroluminescent device 10, and can likewise be cast onto the electroluminescent device or they can electropolymerize in situ after being brought into contact with a voltage source.

When a voltage source 18 is placed in electrical communication with the electroluminescent device 10 it generates an electric field across the electroluminescent device 10. The electric field so generated causes the plurality of structured particles 20 to transport electrons to the emitting species 14 and the hole conductor 16 to transport holes to the emitting species 14.

Referring now to FIG. 2 where another embodiment of the electroluminescent device 30 is shown. As in the previous embodiment, the electroluminescent device 30 comprises, in sequence, an electron conductor 32, an emitting species 34, and a hole conductor 36. As in the previous embodiment the electron conductor 32 is comprised of a plurality of structured particles 42, which are in contact with the emitting species 34. The hole conductor 36 is also in contact with the emitting species 34. Also as in the earlier embodiment, a voltage source 46 generates an electric field across the electroluminescent device 30.

In this embodiment, in contrast to the previous embodiment, an anode 38 is provided on the hole conductor 36 and interposed between the voltage source 46 and the hole conductor 36. The anode 38 has a relatively high work function. The holes from the anode 38 are injected into the hole conductor 36 and then transported across the hole conductor 36 into the emitting species 34 where they can combine with an electron to produce photons. The choices for the anode 38 are well known in the art and include substances such as indium tin oxide ITO as well as organic species.

The electroluminescent device does not need an additional layer to act as a hole conductor, an emitting species material or an anode can perform this function in the absence of a hole conductor. For example, one preferred embodiment of the electroluminescent device that does not contain a hole conductor comprises in sequence ITO, an alkaline earth titanate, poly phenylene vinylene (PPV), and aluminum. In this example the PPV is the emitting species, but it also conducts the holes. The alkaline earth titanate can be a strontium titanate, such as $SrTiO_3$, for example.

As the anode 38 provides the electroluminescent device 30 with an abundance of holes, a cathode 40 similarly provides the electroluminescent device 30 with an abundance of electrons. The cathode 40 is then provided on the electron conductor 32 and interposed between the electron conductor 32 and the voltage source 46. Under the influence of the electric field, generated by the voltage source, electrons are freed from the cathode 40 and emitted into the electron conductor 32. Thereafter, the electron conductor 32 transports the electrons into the emitting species 34 which therein combine with holes to produce photons. Preferably, the cathode 40 has a low work function such that when the electric field is applied across the cathode 40 the electrons will be separated from their orbitals and released into the electron conductor 32. The cathode 40 may be fabricated from an oxide thereby mitigating the effects of oxidation and decreasing the generation of heat. In addition, an oxide is well suited for use as the cathode 40 because the energy level of the conduction band is comparable with many materials commonly used for cathodes. The cathode of this embodiment should have an electron affinity less than 4 volts.

After the electrons are injected into the electron conductor 32 they are transported from the electron conductor 32 into the emitting species 34 by the plurality of structured particles 42. Preferably, the electrons enter the emitting species 34 at an energy state above the acceptor level of the emitting species 34. Thus, they are energetic electrons. Optimally, these energetic electrons meet the holes and recombine to produce an electron at lower state of energy and a photon, seen as an emission of light. The transition energy required to produce a photon is:

$$=E=h\nu$$

where
 E=energy of the photon in eV
 h=$6.626\times10^{-34}$ eV·s, planks constant
 $\nu$=frequency of the photon in Hz or 1/s.

In practice the electroluminescent device 30 is fabricated such that the emitting species 34 produces a photon of a specific wavelength of light as the product of the radiative recombination of the electron and the hole. The wavelength of light can range from the infrared spectrum to the visible spectrum. The wavelength of emitted light is related to its frequency of the emitted photon by the equation:

$$\lambda=c/\nu$$

where
 c=$2.998\times10^8$ m/s, the speed of light
 $\lambda$=wavelength of light in meters.

The wavelength of light emitted is also related to the transition energy of the emitting species 34 by the equation $$\lambda=1.24\times10^{-6}/E$$

where E=transition energy in eV
 $\lambda$=wavelength of light in meters.

The transition energy of a substance is the change of energy between the electrons residing in the acceptor level of a substance and the electrons residing at the energy level to which the electron transitions. Thus, to produce blue light, without filters, having a wavelength of approximately 475 nanometers, a material with a transition energy near 2.61 eV would have to be chosen as the emitting species 34.

Even after the appropriate substances are chosen, the production of photons may be relatively low owing to numerous other reaction pathways available to the excited electrons, including rearrangement, photo dissociation, photo ionization, among others. One such reaction is recombination of the excited electron with a hole. Such a recombination produces an amount of energy less than the energy, E, necessary to emit a photon in the desired range. In order to minimize this loss of energy and increase the quantum efficiency of the electroluminescent device 30, it is desirable that the plurality of structured particles 42 not only exhibit the appropriate work function and electron transport properties, as would a suitable electron conductor, but that, among other properties, it also be non-reactive with the electrons that it transports to the emitting species 34.

There are several ways to make the plurality of structured particles 42 non-reactive. One method is to make the plurality of structured particles 42 have a predetermined transition energy greater than the emitter transition energy or near the acceptor level of the emitting species 34. An example of one method to increase the transition energy of a substance is to decrease the dimensions of the substance and thus form a quantum dot. By choosing a substance with a different effective mass one choose an appropriate transition energy. Both of these phenomena can be illustrated using the time-independent Schrödinger equation. The Schrödinger equation is often used to solve for the energy-band structure of a crystalline solid. The Schrödinger equation is as follows:

$$[(-\hbar^2/2m)\nabla^2 + V(r)]\Phi_k(r) = E\Phi_k(r)$$

Where the solution $\Phi_k(r)$ is a Bloch function. The Bloch theorem states that if a potential energy V(r) is periodic with the periodicy of the lattice, then the solutions of the Schrödinger equation are in the form of a Bloch function. A box can represent a simplified model of site in the lattice. The Schrödinger equation solved for particle in a three-dimensional box can illustrate the dependence of the transition energy of the plurality of structured particles 42 upon mass and dimension and $\Phi_k(x,y,z)$. Using differential equations and boundary conditions the solution of the Schrödinger equation can be expressed in the form of $$E = [(\hbar^2 \pi^2)/(2m)][(n_x^2/a^2) + (n_y^2/b^2) + (n_z^2/c^2)]$$

where n=the quantum numbers associated with each energy state of substance a, b, and c=the dimensions of the particle m=mass of the particle $\hbar$=planks constant divided by $2\pi$.

This equation can be simplified $E = E_o(n_x^2 + n_y^2 + n_z^2)$ when solved for box with sides of the same length, such that a=b=c=1. This final relation and its simplified form demonstrate that the transition energy for each energy state is inversely proportional to the mass of the particle and the square of dimensions of the plurality of structured particles 42. Thus, decreasing the mass and the size of the particle such that the particle is a structured particle, it is clear that the transition energy of each quantum state becomes farther apart.

The electron conductor 32 having of the plurality of structured particles 42 preferably has a predetermined transition energy higher than the energy of the acceptor level of the emitting species 34. In this way, even electrons that undergo a non-radiative or a radiative transition will be at a state higher than the energy of the acceptor level of the emitting species 34. Depositing electrons into the emitting species 34 at a point where their energy is higher than the energy of the acceptor level of the emitting species 34 will facilitate the emitting species 34 to undergo a change of quantum state and emit a photon during the reaction.

The electron conductor 32 is also chosen for its hole-electron recombination time. Optimally, the hole-electron recombination time of the electron conductor 32 should be greater than the hole-electron recombination time of the emitting species 34. The quantum efficiency of the electroluminescent devices can be written relative to the hole-electron recombination time. Where the quantum efficiency is a fraction of excited carriers that combine radiantly to the total recombination rate and they be written in terms of recombination times or life times as follows:

$$n_q = R_r/R = \tau_{nr}/(\tau_{nr} + \tau_r)$$

where $n_q$=quantum efficiency $R_r$=the radiative recombination rate where the radiative recombination rate is the amount of hole-electron recombinations that produce photons R=the total recombination rate which included the non-radiative recombinations $\tau_{nr}$=the hole-electron recombination time, non-radiative life time $\tau_r$=the radiative life time.

The equation shows that quantum efficiency will approach 100 percent when the radiative lifetime approaches zero. Thus, the radiative life time $\tau_r$ should be small to give a high quantum efficiency.

Using the plurality of structured particles 42 not only provides the electroluminescent device 30 with additional efficiency, it allows one to choose a combination of elements for the electron conductor 32, the emitting species 34, and hole conductor 36 that without the plurality of structured particles created an inefficient or unstable device. For instance, the electroluminescent device can be fabricated with an organic emitting species and an inorganic electron conductor. Since emitting species fabricated from an organic substance are known to have better emitting properties and, therefore, are aptly suited to be the emitting species 34.

The plurality of structured particles 42 eliminates some of the problems associated during fabrication such as stacking faults as well as alleviating or mitigating stresses of the fabricated electroluminescent device 30. Because of the decrease in stress, an electroluminescent device with an organic emitting species will have a longer life time if it has an electron conductor 32 comprised of a plurality of structured particles 42. The art has predicted that stresses of considerable magnitude are present in electroluminescent devices with layers. One of the main causes of the stress are due to differences between the thermal properties of the deposited layer and the underlying layer. In a prior art electroluminescent device, the stress can cause holes to form in the cathode. The electroluminescent device having electron conductor 32 comprised of a plurality of structured particles 42 has less stress between the interfaces of the electron conductor 32 and accordingly less deterioration.

Figure 3:
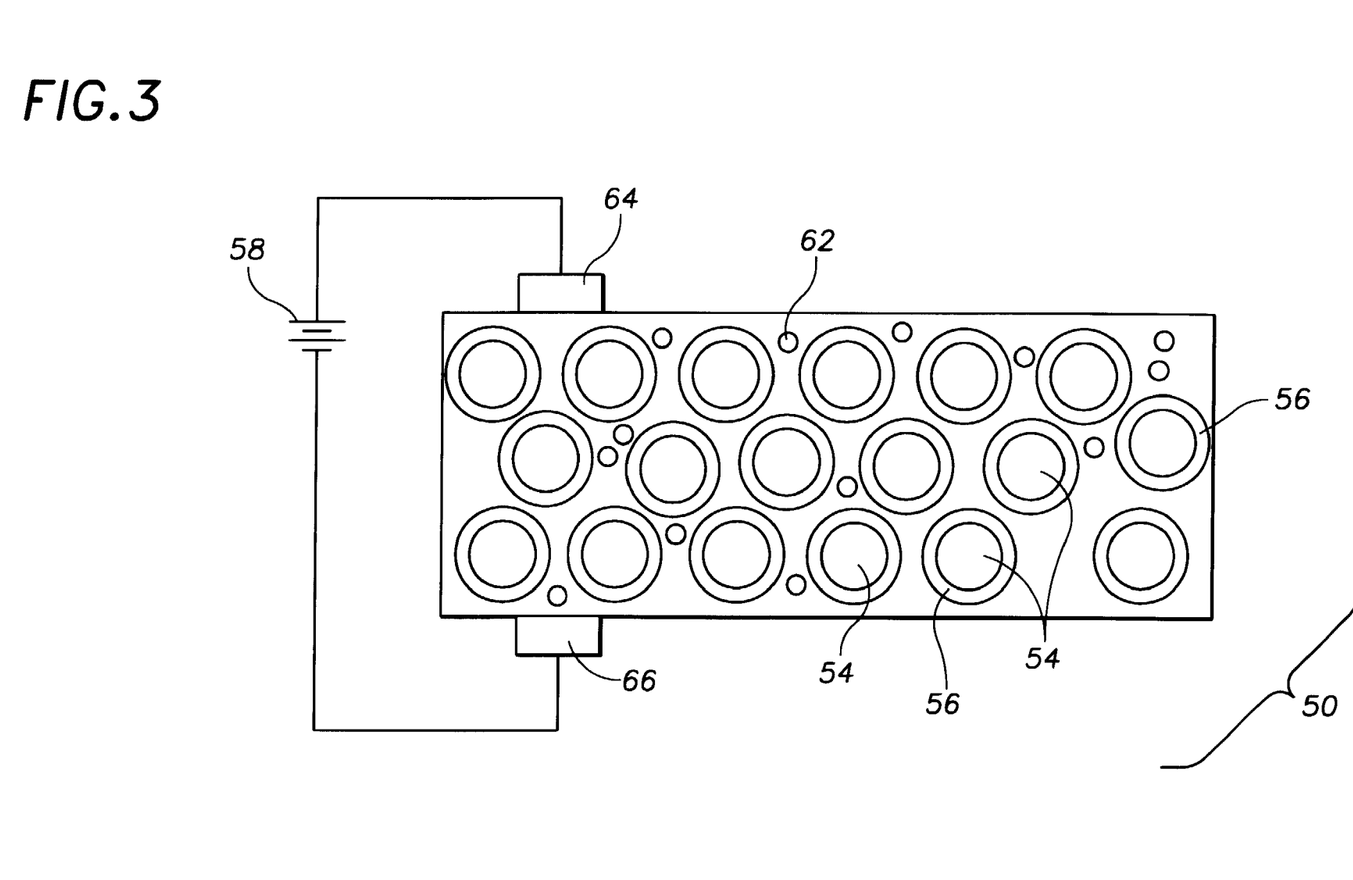
FIG. 3 is a block diagram of a third embodiment of the invention.

In a third embodiment of the electroluminescent device 50, as shown in FIG. 3, an emitting species 56, hole conductor 62, and a plurality of structured particles 54 are not fabricated in layers. However, they are part of an electroluminescent device 50 that is integrated. This structure further serves to decrease stress in the electroluminescent device 50 and accordingly increase its life time. In this embodiment, the restrictions that favor thin films, as are well known in the art, are mitigated or eliminated. The layers of the electroluminescent device can be thin, but it does not have to be thin.

The electroluminescent device 50 comprises an anode 64 and a cathode 66 both in electrical communication with a voltage source 58. Disposed between the anode 64 and the cathode 66 are the integrated form of the emitting species 56, hole conductor 62, and the plurality of structured particles 54. A voltage source 58 generates an electric field across the electroluminescent device 50. Again, the plurality of structured particles 54 transmit the electrons under the influence of the electric field acting as the electron conductor to the emitting species 56, and the hole conductor 62 transports holes under the influence of the electric field to the emitting species 56, wherein the electrons and the holes meet and recombine to generate a photon. The transport of the hole conductor 62 and the electron conductor 54 can overlap in time while occurring at different positions within the electroluminescent device 50. Due to the integrated nature of the electroluminescent device 50, the transport can occur in parallel in different positions of the device, but at the same position with respect to an anode 64 or a cathode 66. The geographic position within the device where recombination most often occurs will differ from the layered device and depend on the properties and energy characteristics of the electron conductor 54, the hole conductor, 62, and the emitting species 56, as well as the presence or the absence of a voltage source 68 and its characteristics. The electroluminescent device does not need an additional substance to act as a hole conductor, the emitting species material or an anode material can perform this function in absence of a hole conductor.

In this embodiment the emitting species 56 is interposed between the plurality of structured particles 54 and the hole conductor 62, thus providing ease of fabrication. If the plurality of structured particles 54 is formed first, the remaining substances can be dispersed within the plurality of structured particles 54 by processes such as diffusion, inter alia. The plurality of structured particles 54 can be formed concurrently with or after the remaining substances. The plurality of structured particles 54 need only be brought into electrical contact with one another such that they can transport electrons to the emitting species 56.

The emitting species 56 can be attached to surfaces of the plurality of structured particles 54 through a range of chemical attractions. The chemical attraction can range from covalent bonding to chelation to hydrogen bonding, and can be in combination with any amount of coulombic or Van der Waals interactions with a portion of the surfaces of the plurality of structured particles 54. The degree of attachment for the hole conductor 62 is not as essential.

Figure 4:
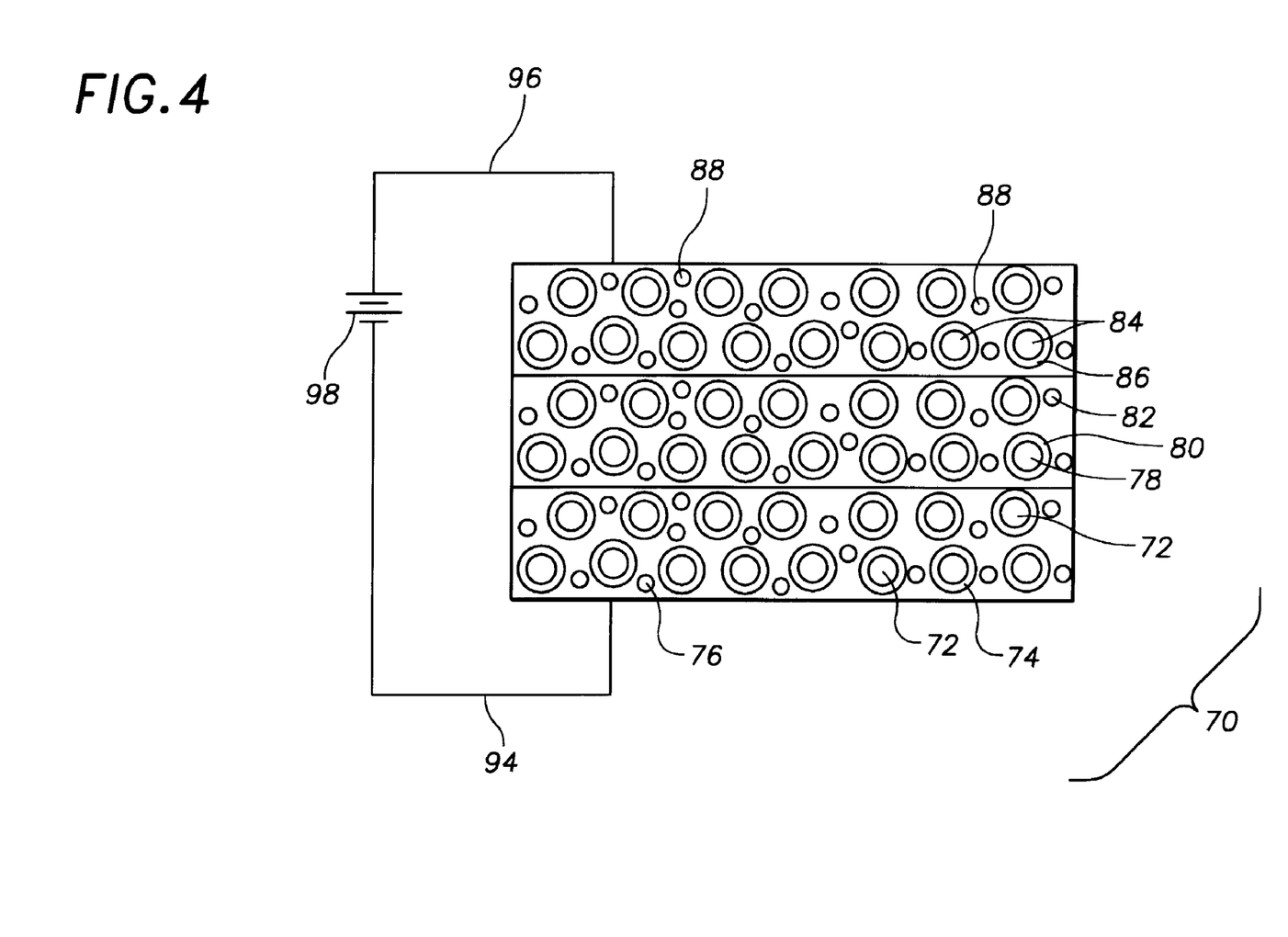
FIG. 4 is a block diagram of a fourth embodiment of the invention.

FIG. 4 illustrates another embodiment of the invention. An electroluminescent device 70 comprising a voltage source 98 and more than one of the electroluminescent devices as shown in FIG. 3 positioned on each other. Each electroluminescent device 70 contains a plurality of structured particles 72, 78, 84, and emitting species 74, 80, 86, and hole conductors 76, 82, and 88. An advantage of this device is that one can fabricate the electroluminescent device to emit more than one wavelength of light such that the first emitting species 74 emits one predetermined wavelength of light while the second emitting species 80 emits a second predetermined wavelength of light and the third emitting species 86 emits a third predetermined wavelength of light. For example, a well known application in the art utilizes LCDs that emit red, blue and green. The electroluminescent device 70 can mimic an LCD that emits red, blue and green light, with or without filters. The first emitting species 74 would emit red, the second emitting species 80 would emit green and the third emitting species would 86 emit blue. It should be obvious to those skilled in the art, that the electroluminescent device 70 can be fabricated of one or more than one layer, where each layer contains a plurality of structured particles, an emitting species, and a hole conductor.

It should also be obvious to those skilled in the art that the electron conductor comprised of the plurality of structured particles can also be used as the emitting species in any of the illustrated electroluminescent devices such that the electroluminescent device comprises in sequence a combination electron conductor and emitting layer juxtaposed to a hole conductor layer. In this embodiment the recombination of the holes and the electrons would primarily take place at a different position within the electroluminescent device.

It should also be evident to those skilled in the art that the electroluminescent device can be fabricated without a hole conductor.

The invention may be embodied in other specific forms without departing from the spirit or the essential characteristics thereof The present embodiments are therefore to be considered in all respects as illustrative and not restrictive. The scope of the invention being indicated by the appended claims rather than the foregoing description. All the changes which come within the meaning and the range of equivalency of the claims are therefore intended to be embraced therein.

The embodiments of the invention in which an exclusive property or privilege is claimed are defined as follows:

1. An electroluminescent device for generating light, comprising:
    a region comprising an organic hole conductor;
    an emitting species capable of emitting light in response to a hole-electron recombination; and
    a region comprising an electron conductor, the electron conductor comprising a plurality of structured metal oxide particles, at least some of which are in electrical communication with each other,
    wherein the hole conductor region and the electron conductor region are in electrical communication with a voltage source capable of generating an electric field across the electroluminescent device.

2. The electroluminescent device of claim 1, wherein the emitting species functions as the hole conductor.

3. The electroluminescent device of claim 2, wherein the emitting species comprises polyphenylenevinylene (PPV).

4. The electroluminescent device of claim 2, wherein the emitting species and the electron conductor are located in the same single region.

5. The electroluminescent device of claim 2, wherein said metal oxide is selected from the group consisting of alkaline earth titanates, ZnO and $TiO_2$.

6. The electroluminescent device of claim 1, wherein the structured particles have a particle size in the range of 1 to 900 nm.

7. The electroluminescent device of claim 1, wherein the size of the structured particles is selected to provide a transition energy greater than a transition energy of the emitting species or a transition energy of the structured particles near an acceptor level of the emitting species.

8. The electroluminescent device of claim 1, wherein at least a portion of the structured metal oxide particles are amorphous.

9. The electroluminescent device of claim 1, wherein at least a portion of the structured metal oxide particles are crystalline.

10. The electroluminescent device of claim 1, wherein the emitting species is comprised of an organic compound.

11. The electroluminescent device of claim 1, wherein the emitting species is comprised of a material having an organometallic composition.

12. The electroluminescent device of claim 1, wherein the emitting species comprises a conductive polymer.

13. The electroluminescent device of claim 1, wherein the emitting species comprises a compound selected from the group consisting of dyes derived from squaric acid, $Alq_3$ (aluminum trisquinolate), Ru(II)trisbipyridyl complexes, Ru(II)trisphenanthroline complexes, molecules containing a perylene chromophore, and polyphenylenevinylene polymer.

14. The electroluminescent device of claim 1, further comprising:
   a cathode in electrical communication with and adjacent to the electron conductor region and in electrical communication with the voltage source which provides electrons to the plurality of structured metal oxide particles; and
   an anode in electrical communication with the hole conducting region and the voltage source which provides holes to the hole conducting region.

15. The electroluminescent device of claim 14, wherein the cathode is comprised of an oxide material.

16. The electroluminescent device of claim 15, wherein the cathode is comprised of indium tin oxide (ITO).

17. The electroluminescent device of claim 1, wherein the regions are layers.

18. An integrated electroluminescent device for generating light, comprising:
   a plurality of structured metal oxide particles in electrical contact with each other;
   an emitting species coating the metal oxide particles, the emitting species being capable of emitting light in response to a hole-electron recombination; and
   an organic hole conductor,
   wherein the emitting species-coated structured metal oxide particles and the organic hole conductor are positioned and arranged to form an integrated electroluminescent device,
   wherein the integrated electroluminescent device is in electrical communication with a voltage source capable of generating an electric field across the integrated electroluminescent device.

19. The electroluminescent device of claim 18, wherein the emitting species functions as the hole conductor.

20. The electroluminescent device of claim 18, wherein the emitting species comprises polyphenylenevinylene (PPV).

21. The electroluminescent device of claim 18, wherein said metal oxide is selected from the group consisting of ZnO, $TiO_2$ and $SrTiO_3$.

22. The electroluminescent device of claim 21, wherein the structured particles have a particle size in the range of 1 to 900 nm.

23. The electroluminescent device of claim 21, wherein the size of the structured particles is selected to provide a transition energy greater than a transition energy of the emitting species or near an acceptor level of the emitting species.

24. The electroluminescent device of claim 18, wherein at least a portion of the structured metal oxide particles are amorphous.

25. The electroluminescent device of claim 18, wherein at least a portion of the structured metal oxide particles are crystalline.

26. The electroluminescent device of claim 18, wherein the emitting species comprises a compound selected from the group consisting of dyes derived from squaric acid, $Alq_3$ (aluminum trisquinolate), Ru(II)trisbipyridyl complexes, Ru(II)trisphenanthroline complexes, molecules containing a perylene chromophore, and polyphenylenevinylene polymer.

27. The electroluminescent device of claim 18, further comprising:
   a cathode and anode in electrical communication with the voltage source and between which are disposed the emitting species, hole conductor, and plurality of structured particles.

28. The electroluminescent device of claim 18, further comprising:
   a plurality of electroluminescent devices, each of which is in electrical communication with said devices to which it is adjacent, each said device comprising a plurality of structured metal oxide particles, emitting species and hole conductor, wherein the emitting species of each said device is selected to emit at a predetermined wavelength of light.

29. The electroluminescent device of claim 28, wherein the predetermined wavelength of light differs for each emitting species of each said integrated device.

* * * * *